US009131591B2

(12) United States Patent
Seemann et al.

(10) Patent No.: US 9,131,591 B2
(45) Date of Patent: Sep. 8, 2015

(54) SOLAR POWERED OPERATION OF MEDICAL DEVICES

(75) Inventors: Ralf Seemann, Weisendorf (DE); Peter Tichy, Uttenreuth (DE)

(73) Assignee: Siemens Aktiengesellschaft, München (DE)

( * ) Notice: Subject to any disclaimer, the term of this patent is extended or adjusted under 35 U.S.C. 154(b) by 211 days.

(21) Appl. No.: 13/006,176

(22) Filed: Jan. 13, 2011

(65) Prior Publication Data

US 2011/0178744 A1 Jul. 21, 2011

(30) Foreign Application Priority Data

Jan. 15, 2010 (DE) ........................ 10 2010 004 720

(51) Int. Cl.

*G01R 31/36* (2006.01)
*H05G 1/54* (2006.01)
*H05G 1/10* (2006.01)
*H05G 1/32* (2006.01)
*H05G 1/30* (2006.01)

(52) U.S. Cl.

CPC . *H05G 1/10* (2013.01); *H05G 1/30* (2013.01); *H05G 1/32* (2013.01)

(58) Field of Classification Search

CPC ............. H05G 1/44; H05G 1/10; H05G 1/30; H05G 1/06; H05G 1/38; H05G 1/46; H05G 1/64; H05G 1/08; H05G 1/26; H05G 1/58; H05G 1/60; H05G 1/02; H05G 1/12; H05G 1/265; H05G 1/32; H05G 1/56; H05G 1/66; G06F 19/3412; H02J 15/00; H02J 7/0047

USPC ........................................................... 702/63

See application file for complete search history.

(56) References Cited

U.S. PATENT DOCUMENTS

| | | | | |
|---|---|---|---|---|
| 5,530,362 | A * | 6/1996 | Boehm et al. | 324/427 |
| 7,356,121 | B2 * | 4/2008 | Schwarz | 378/101 |
| 7,853,813 | B2 * | 12/2010 | Lee | 713/320 |
| 2001/0043050 | A1 * | 11/2001 | Fisher, Jr. | 320/101 |
| 2002/0077760 | A1 * | 6/2002 | Cole | 702/63 |
| 2006/0079938 | A1 * | 4/2006 | Fleenor et al. | 607/5 |
| 2006/0274890 | A1 * | 12/2006 | Razzano | 378/197 |
| 2009/0207973 | A1 * | 8/2009 | Yi | 378/101 |
| 2010/0207585 | A1 * | 8/2010 | Duvalsaint et al. | 320/136 |

FOREIGN PATENT DOCUMENTS

| | | | |
|---|---|---|---|
| CN | 1283374 | A | 2/2001 |
| CN | 101507608 | A | 8/2009 |
| WO | 9933296 | A1 | 7/1999 |

OTHER PUBLICATIONS

Chinese Office Action dated Dec. 20, 2013 for corresponding Chinese Patent Application No. 201110007378.0 with English translation.

Chinese Office Action cited in CN201110007378.0, mailed Jul. 30, 2014.

* cited by examiner

*Primary Examiner* — Eliseo Ramos Feliciano
*Assistant Examiner* — Terence Stifter. Jr.
(74) *Attorney, Agent, or Firm* — Lempia Summerfield Katz LLC

(57) ABSTRACT

A medical device includes an energy storage unit that is configured for being supplied with solar energy. The medical device is configured for an evaluation of a charging state of the storage unit according to a medical workflow and for the output of information related to the result of the evaluation or a signal related to the evaluation. A supply of energy is provided during the workflow.

19 Claims, 2 Drawing Sheets

SOLAR POWERED OPERATION OF MEDICAL DEVICES

This application claims the benefit of DE 10 2010 004 720.1, filed on Jan. 15, 2010.

BACKGROUND

The present embodiments relate to a medical device with an energy storage unit that is configured to be supplied with solar energy.

In many developing countries (e.g., Africa, India, and Western China), the supply of power via power supply networks is insufficient or entirely non-existent in rural areas.

Any power supply networks that do exist may not be sufficiently extensive to meet the demand and are not adequately safeguarded against failures. With the existing power supply, network fluctuations and interruptions occur.

Therefore, fossil-fuel powered generating sets may be used in order to generate power in a reliable manner.

Another source of energy used in many of the developing countries referred to above is solar energy.

The direct conversion of solar energy into electrical energy may take place using solar cells. This technology is also referred to as photovoltaics and dates back to the 1950s. The first applications were in the field of space travel. Photovoltaics have opened up a range of other fields of application (e.g., mobile telephones, which have received much attention in recent years).

This development is supported by improvements in the field of solar cells (see, e.g., EP 1160879 A2) and energy storage (see, e.g., US 2003/0035261 A1), which bring more fields of implementation into scope.

US 2006/0274890 A1, for example, discloses a portable, solar-powered diagnostic device for applications in dental medicine.

Many demands are placed on photovoltaic applications in the medical field, which are not fulfilled by solar-powered devices in the prior art.

Such demands relate to, for example, safety requirements and demands concerning typical workflows in the medical field.

SUMMARY AND DESCRIPTION

The present embodiments may obviate one or more of the drawbacks or limitations in the related art. For example, supply of medical devices with solar energy may be improved.

Embodiments and advantages explained below in connection with the X-ray device also apply correspondingly to the method and vice versa.

The present embodiments proceed from the basis of a medical device (e.g., a radiography device, a mammography device, a computed tomography device, a mobile or stationary C-arm, an ultrasound device, or a magnetic resonance imaging device) with an energy storage unit that is configured for being supplied with solar energy. The medical device is configured, according to the present embodiments, to perform an evaluation of a charging state of the storage unit according to a medical workflow and for the output of information related to the result of the evaluation or a signal related to the evaluation (e.g., a control signal). Information may be output, and a signal may be generated. The information may relate to the feasibility of executing the medical workflow and is, for example, visibly reproduced on a display for the operating personnel. An acoustic output of the information may also be produced. A signal output may be, for example, the control signal. For example, the workflow is thus enabled (e.g., the workflow is blocked until the charging state of the storage unit will allow a correct workflow or a proper execution).

The medical workflow may be, for example, the execution of one or more patient examinations or patient treatments (e.g., a single examination: an X-ray recording or a plurality of X-ray recordings carried out during a diagnosis that are compiled to form a three-dimensional image). A combined workflow may also come into question. The combined workflow includes, for example, one or more diagnostic steps and one or more treatment steps. In this case, the medical device may be part of a medical system including a plurality of medical devices that all access the energy storage unit. Checks may be geared such that sufficient energy is available in the storage unit for all devices involved in the workflow for a correct workflow.

The present embodiments have the advantage that a supply of energy during the workflow is provided. The possibility of a workflow having to be interrupted or prematurely ended due to an insufficient quantity of energy stored is prevented. The unnecessary use of resources in terms of devices, personnel and energy is avoided, and radiation producing no result due to premature termination and thus unnecessary exposure of the patient to radiation is prevented.

Therefore, due to uncertainties or existing tolerances leading to inaccuracies affecting the workflow, an energy reserve, which is not undershot in a planned workflow, may be provided in the storage unit.

In one embodiment, the device may be configured for an additional supply using a network connection. The additional supply using the network connection allows resources made available via a network (e.g., a power network) to be accessed when the resources are available. For example, the storage unit may be configured for charging both using solar energy and also using network energy. This embodiment may be useful for mobile devices that are implemented in different situations relating to the energy supply (e.g., available and sufficient network supply or a network supply that is reliable/unreliable).

The present embodiments also relate to a method for evaluating a charging state of an energy storage device according to a medical workflow, where the storage unit is configured to be supplied with solar energy. During the method, the charging state of the storage unit is ascertained. An energy available according to the charging state is determined. "Energy" may be a variable relating to the energy of the storage unit (e.g., a total stored energy, an available power, a voltage that may be produced for a period of time). In one embodiment, the variable is selected, such that a relationship with the feasibility of executing the workflow may be made. For the workflow, the corresponding variable and energy are determined. Both values for energy (e.g., value for energy available in the storage unit and value for the energy required in the workflow) are compared and evaluated as to whether sufficient energy is available in the storage unit for the medical workflow. Information is output or a signal generated according to the result of the evaluation.

In one embodiment, when the result of the evaluation is positive (e.g., when the energy available in the storage unit is greater than or equal to that required for the workflow), the medical workflow is enabled.

The device may be configured for making a change to the medical workflow in the event of a negative result of the evaluation in order to reduce the energy required. The change in the medical workflow to reduce the energy required may be suggested by a controller of the device.

After the change in the medical workflow in response to the negative result, a new evaluation (e.g., automatic) may be carried out.

In one embodiment, a time period, after which the charging state of the storage unit allows the medical workflow to be carried out, is estimated for a negative result of the evaluation. Once the time period has expired, a new evaluation may be executed.

DETAILED DESCRIPTION OF THE DRAWINGS

Figure 1:
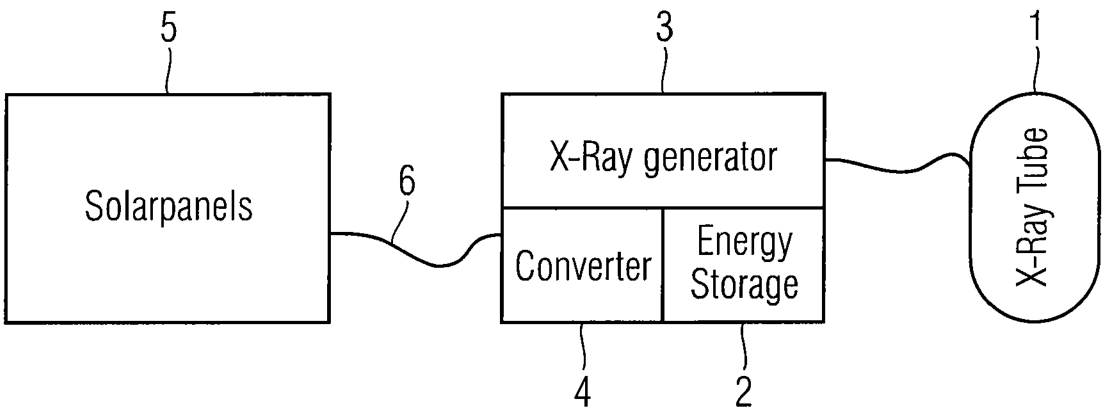
FIG. 1 is a schematic representation of the supply of a medical device with solar energy.

FIG. 1 shows schematically the supply or feeding of an X-ray tube 1 with solar energy. X-ray devices may use a high voltage in the range of 25 to 150 kV, for example. The high voltage is produced by a generator 3. The energy supply or voltage supply for the generator 3 is provided by an energy storage unit 2 (e.g., storage unit). The voltage supply for the generator 3 may fall below a voltage of 50 V. The energy storage unit 2 is charged using solar panels or solar collectors 5 that may be formed of solar cells, for example. The solar panels 5 are connected to an electronic system 4 of the X-ray device using a wire 6, for example. The electronic system 4 has circuitry that assumes functions for charging of the storage unit 2 (e.g., overvoltage protection and conversion tasks). In the electronic system 4, the solar panels 5 may be located separately from the X-ray device. For example, the solar panels 5 may be mounted on the roof of a house or a vehicle, where the house or the vehicle has an interface, via which the X-ray device may be connected for the charging process.

A storage system based on batteries (e.g., lead batteries) or supercapacitors (e.g., electrochemical dual-layer capacitors) may be used, for example, as the energy storage unit 2.

Figure 2:
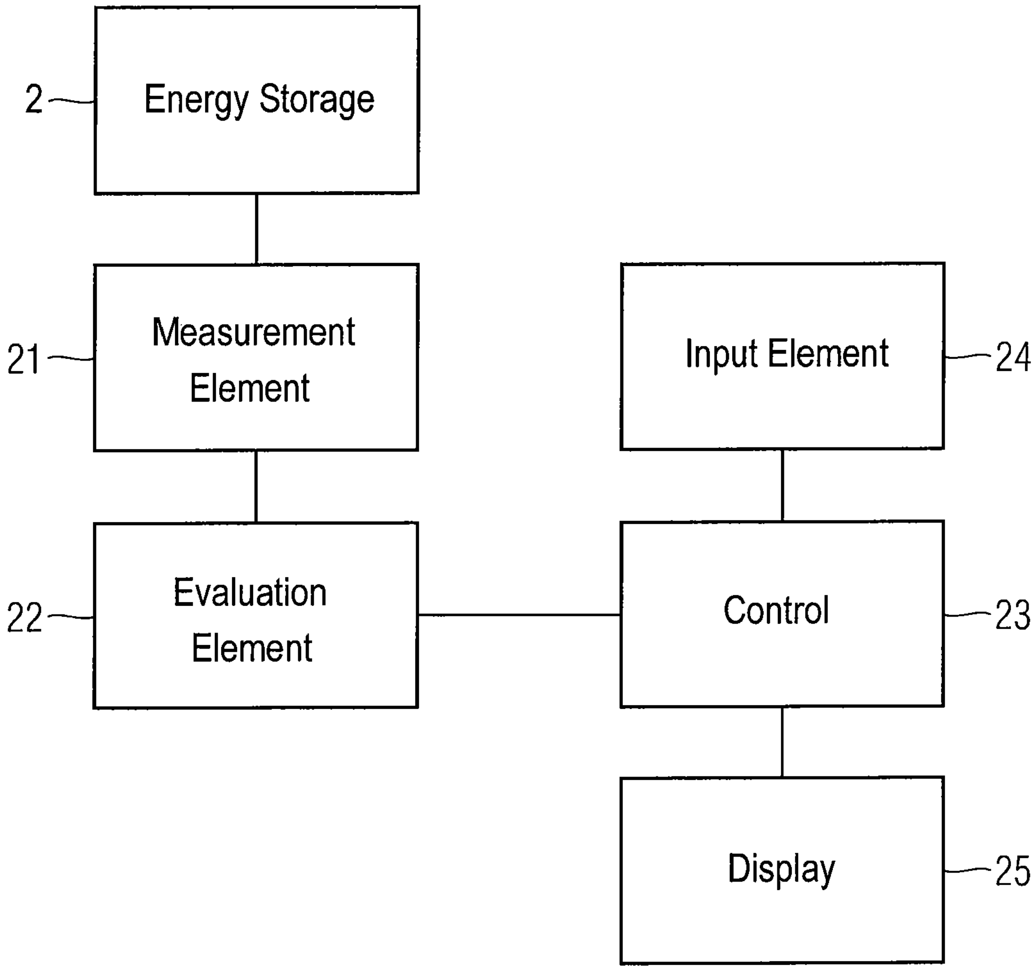
FIG. 2 is a schematic representation of one embodiment of a medical device.

For X-ray recordings, a considerable power is intermittently used (e.g., in pulsed operation). With the present embodiments, examinations may not be interrupted due to problems with the energy supply. An interruption of an examination not only has the disadvantage that resources in devices and personnel are used to no avail but also the disadvantage that the patient is subjected to an unnecessary dose of radiation (e.g., since the examination is not brought to a conclusion and therefore, no result is produced). The present embodiments start with this basis. According to the present embodiments, an energy supply is provided during the examination, in which a medical workflow is connected with the charging state of the storage unit 2. The charging state according to the workflow or examination or treatment to be performed is evaluated. As shown in FIG. 2, the storage unit 2 is associated with a measuring element 21 that detects the charging state. The measuring element 21 makes information about the charging state available to an evaluation element 22, which includes logic used for the evaluation. The evaluation element 22 is connected to a control 23 of the X-ray device. In the control 23, information is provided regarding the workflow to be performed. The workflow to be performed may be adjusted or predetermined via parameters using an input element 24 (e.g., console). For example, an adjustment may be made that recordings are carried out in pulsed operation with predetermined current and voltage values (e.g., adjustment information). The adjustment information is made available to the evaluation element 22, which determines the energy quantity required for the adjustment. On the basis of the measured charging state and the energy quantity required, an evaluation is carried out as to whether the intended examination may be successfully brought to a conclusion. To prevent measurement inaccuracies and unforeseen energy requirements, a residual energy may remain in the storage unit 2 even after the examination (e.g., the storage unit 2 includes a minimum storage energy that may be set). The result of the evaluation leads to an output of information on a display 25 regarding the feasibility of executing the examination. In addition, a signal may be transmitted to the control 23. Using the signal, the intended examination may be enabled and started.

In one embodiment, the evaluation or detection of an energy content of the storage unit 2 may be performed as described below.

In one embodiment, the energy storage unit 2 is implemented using supercapacitors. The storage unit 2 supplies, for example, an inverter with a predetermined direct voltage $U_{DC}$ (e.g., a minimum of 450V for the enabling of a recording) that is achieved at the start of the recording. A linear charging current for the supercapacitors or the capacitance bank thus produced may be provided.

From the linear relationship $Q=C*U=I*t$ (Q: capacitor charging, C: capacitance, U: voltage, I: current, t: time), a charging time of a given capacitance variable at a particular voltage value U may be calculated and/or measured.

Capacitance values C may change over time (e.g., aging). The capacitance values C may reduce. The change may be seen on the basis of the known charging current and the voltage that is to be constantly achieved. The scope of the change may be calculated or measured (e.g., charging time t shortens when a capacitance value C decreases). A reduction in the storage capacity may thus be calculated therefrom and considered during the evaluation of the charging state.

For an original capacitance, a discharge curve exists for the voltage, the discharge curve describing the associated drop in voltage by $\Delta U$ when a particular energy content is withdrawn.

A capacitance that is reducing over time results in the change in the discharge curve. The changed capacitance may be determined as described above. For the changed capacitance, a corresponding discharge curve can be ascertained.

For the evaluation of a reliable recording in relation to the energy supply, at least the following three variables are now brought into play:

1. Consideration of an internal voltage drop due to a resistance $R_i$ in the entire discharge circuit.
2. Consideration of a charging quantity required for the recording (e.g., a parameter specified in mAs) and resulting from this, a voltage drop that occurs (as an additional criterion, the parameter voltage drop may include a margin from a minimum permissible value (i.e., whether the voltage drop is greater than the sum of the minimum permissible value and margin may be checked)).
3. The availability of a minimum required direct current $U_{DC}$ that may not be undershot with the selected recording parameters (e.g., tube current and voltage) is checked. This may take place with the aid of a table of kV parameters (e.g., there is a minimum direct voltage $U_{DC}$, with which the selected kV value may also be achieved. This may depend on the transformer transmission ratio). The availability of the minimum required direct current $U_{DC}$ is dependent on the charging quantity withdrawn.

Figure 3:
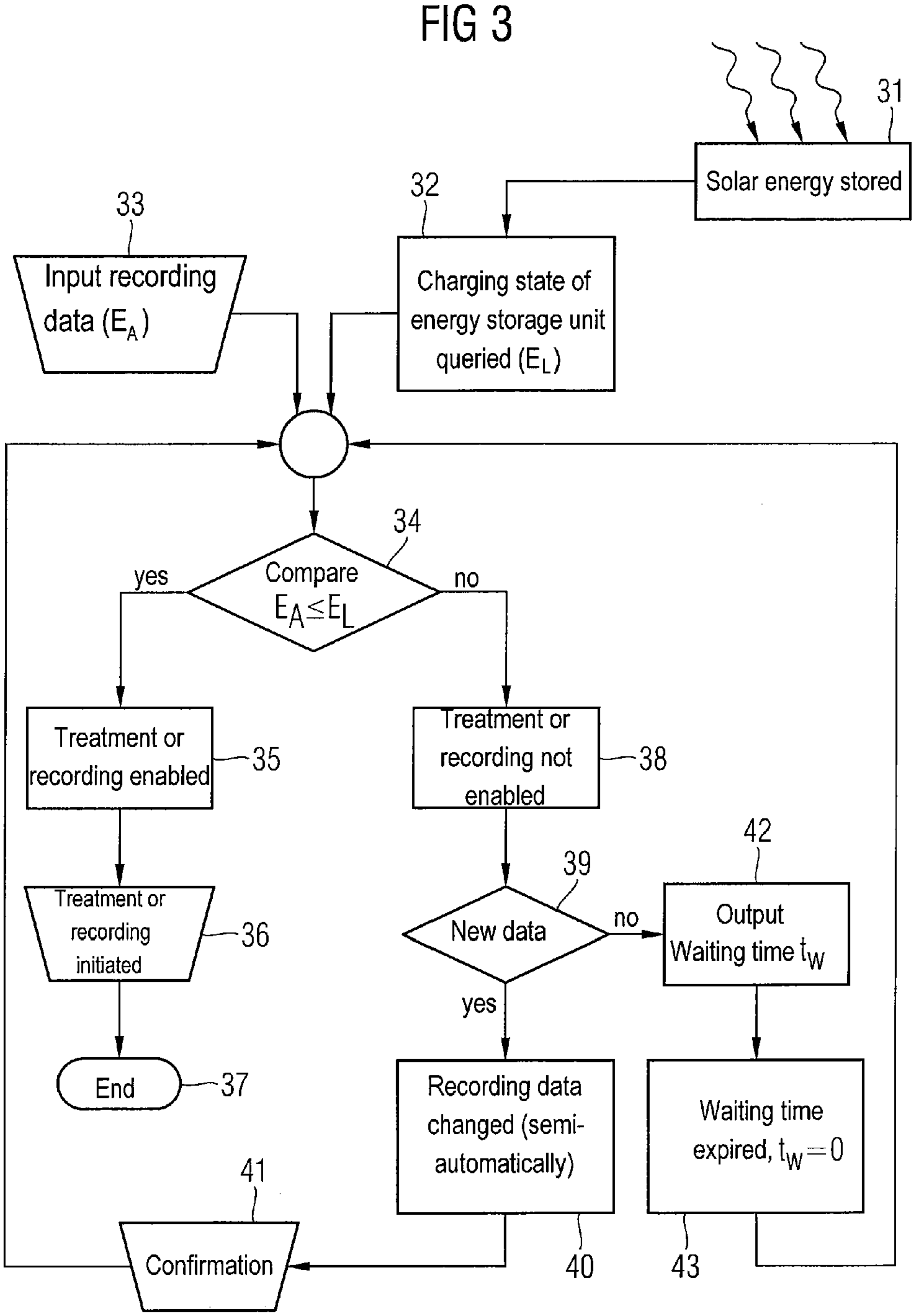
FIG. 3 is a workflow diagram of one embodiment of a method for evaluating a charging state of an energy storage unit of a medical device.

FIG. 3 illustrates a procedure according to the present embodiments in more detail. In act 31, solar energy is stored in an energy storage unit. This may be a continuous process. In act 32, the charging state of the energy storage unit is queried or measured, and the energy $E_L$ available is detected. The energy $E_L$ available may be smaller than a total energy $E_{total}$ stored in the energy storage unit in order to provide a certain redundancy. In other words, a residual energy $E_R$ that remains in the storage unit 2 may be defined for safety reasons ($E_L = E_{total} - E_R$).

With reference to the regulated examination or the recording data input, the $E_A$ required for the examination is determined (act 33). In act 34, the two energy variables $E_A$ and $E_L$ are compared. If the required energy $E_A$ is smaller or equal to the energy $E_L$ available, the treatment or recording is enabled in act 35 and initiated in act 36. The query process may be terminated (act 37). If the required energy $E_A$ is greater than the energy $E_L$ available, a signal is output indicating that the recording cannot be executed (act 38). In act 39, the recording parameters may be adapted or changed such that the recording parameters may be executed with the available energy quantity $E_L$. If this option is detected, a change in the recording data is made in act 40; the change in the recording data may happen semi-automatically (e.g., using an automatically generated suggestion for a change). The change in the recording data is confirmed in act 41, and a receipt is issued. A check is performed as to whether the required energy $E_A$ is sufficient. If the recording parameters are not to be changed, a waiting time $t_w$ that is necessary for achieving a charging state of the energy storage unit 2 that allows the treatment to be carried out is estimated in act 42. Once the waiting time $t_w$ has expired (e.g., $t_w=0$), an evaluation or a comparison is made as to whether the examination may be carried out (act 43).

The present embodiments are not limited to the case illustrated above. The present embodiments may be used for any medical devices.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A medical device comprising:
an energy storage unit that is operable to be supplied with solar energy;
an X-ray source supplied by the energy storage unit; and
a controller configured to:
evaluate a charging state of the energy storage unit according to a medical workflow, the medical workflow comprising administration of an x-ray dose using the X-ray source, the evaluation of the charging state including an evaluation of whether sufficient energy is stored in the energy storage unit to complete the medical workflow;
when insufficient energy is stored in the energy storage unit to complete the medical workflow, predict a waiting time for sufficient energy to be stored in the energy storage unit to complete the medical workflow;
output information related to a result of the evaluation of the charging state or a signal related to the evaluation of the charging state;
enable the medical workflow including the administration of the x-ray dose using the X-ray source when a result of the evaluation of whether sufficient energy is stored in the energy storage unit is positive, the administration of the x-ray dose being blocked until the enablement; and
change the medical workflow when the result of the evaluation is negative in order to reduce the energy required, such that the medical workflow is executable; or
output a suggested change in the medical workflow to reduce the energy required, such that the medical workflow is executable,
wherein the prediction of the waiting time comprises an estimation of the waiting time when the result of the evaluation is negative, the charging state of the energy storage unit allowing the execution of the medical workflow after the waiting time.

2. The medical device as claimed in claim 1, wherein the medical workflow relates to the execution of one or more patient examinations, patient treatments or patient examinations and treatments.

3. The medical device as claimed in claim 1, wherein the energy storage unit is configured to provide a reserve energy that is not undershot in a planned workflow.

4. The medical device as claimed in claim 1, further comprising a network connection configured for an additional energy supply.

5. The medical device as claimed in claim 4, wherein the storage unit is operable to be charged by solar energy and via the network connection.

6. The medical device as claimed in claim 1, wherein the controller is configured to evaluate the charging state of the energy storage unit using an internal voltage drop in a discharge circuit of the medical device, a required charging quantity for the workflow, a minimum direct current required, or a combination thereof.

7. The medical device as claimed in claim 1, wherein the medical device is a medical X-ray device.

8. The medical device as claimed in claim 1, wherein the evaluation of the charging state of the energy storage unit comprises:
a determination of the charging state of the energy storage unit;
a determination of an energy available according to the charging state of the energy storage unit;
a determination of an energy required for the medical workflow; and
a comparison of the energy available and the energy required.

9. A method for evaluating a charging state of an energy storage unit of a medical device according to a medical workflow, the storage unit being operable to be supplied with solar energy, the medical device including an X-ray source supplied by the energy storage unit, the method comprising:
determining the charging state of the energy storage unit;
determining an energy available according to the charging state of the energy storage unit;
determining an energy required for the medical workflow, the medical workflow comprising administration of an x-ray dose;
comparing the energy available and the energy required and evaluating whether sufficient energy is stored in the energy storage unit to complete the medical workflow;
when insufficient energy is stored in the energy storage unit to complete the medical workflow, predicting a waiting time for sufficient energy to be stored in the energy storage unit to complete the medical workflow;
generating information or a signal according to a result of the evaluation;

executing the medical workflow including the administration of the x-ray dose using the X-ray source when the result of the evaluation is positive, the administration of the x-ray dose being blocked until the executing; and changing the medical workflow when the result of the evaluation is negative in order to reduce the energy required, such that the medical workflow is executable; or outputting, by a controller of the medical device, a suggested change in the medical workflow to reduce the energy required, such that the medical workflow is executable, wherein predicting comprises estimating the waiting time when the result of the evaluation is negative, the charging state of the energy storage unit allowing the execution of the medical workflow after the waiting time.

10. The method as claimed in claim 9, further comprising changing the medical workflow when the result of the evaluation is negative in order to reduce the energy required.

11. The method as claimed in claim 9, further comprising outputting, by a controller of the medical device, a suggested change in the medical workflow to reduce the energy required.

12. The method as claimed in claim 11, further comprising changing the medical workflow when the result of the evaluation is negative in order to reduce the energy required.

13. The method as claimed in claim 10, further comprising evaluating whether sufficient energy is stored in the energy storage unit after the medical workflow is changed in response to the negative result.

14. The method as claimed in claim 9, further comprising evaluating whether sufficient energy is stored in the energy storage unit once the waiting time has expired.

15. The medical device as claimed in claim 2, wherein the energy storage unit is configured to provide a reserve energy that is not undershot in a planned workflow.

16. The medical device as claimed in claim 2, further comprising a network connection configured for an additional energy supply.

17. The medical device as claimed in claim 3, further comprising a network connection configured for an additional energy supply.

18. The method as claimed in claim 11, further comprising evaluating whether sufficient energy is stored in the energy storage unit after the medical workflow is changed in response to the negative result.

19. The method as claimed in claim 9, wherein the medical device is a medical X-ray device.

* * * * *